United States Patent [19]

Watanabe et al.

[11] Patent Number: 4,937,133
[45] Date of Patent: Jun. 26, 1990

[54] FLEXIBLE BASE MATERIALS FOR PRINTED CIRCUITS

[75] Inventors: Hisashi Watanabe, Kisarazu; Seiji Satou, Kimitsu; Akira Tokumitsu, Kimitsu; Kazuya Miyamoto, Kimitsu; Haruhiko Aoi, Tokyo, all of Japan

[73] Assignee: Nippon Steel Chemical Co., Ltd., Tokyo, Japan

[21] Appl. No.: 329,139

[22] Filed: Mar. 27, 1989

[30] Foreign Application Priority Data

Mar. 28, 1988 [JP] Japan .................................. 63-71818
Mar. 28, 1988 [JP] Japan .................................. 63-71819

[51] Int. Cl.$^5$ ............................................. B32B 9/00
[52] U.S. Cl. ................................... 428/209; 428/212; 428/457; 428/458; 428/473.5; 428/901; 174/254; 361/397; 361/398
[58] Field of Search ............... 428/209, 473.5, 457, 428/458, 901, 212; 174/68.5; 361/397, 398

[56] References Cited

U.S. PATENT DOCUMENTS 4,513,055  4/1985  Leibowitz ........................ 428/245
4,526,835  7/1985  Takahashi et al. ................ 428/413
4,569,692  2/1986  Butt ................................... 428/212
4,772,496  9/1988  Maeda et al. ..................... 428/209

FOREIGN PATENT DOCUMENTS 56-23719   3/1981  Japan .
56-94698   7/1981  Japan .
60-157280  8/1985  Japan .
60-243120  12/1985 Japan .

*Primary Examiner*—Patrick Ryan
*Attorney, Agent, or Firm*—Armstrong, Nikaido, Marmelstein, Kubovcik & Murray

[57] ABSTRACT

Flexible printed circuit base materials of this invention are composed of at least one layer of polyimide resins of low thermal expansion, at least one layer of polyimide resins of high thermal expansion with a higher linear expansion coefficient than that of the foregoing polyimide resins, and at least one layer of a conductor, highly reliable in dimensional stability to temperature changes, adhesive strength, and flatness after the etching, easy to work with in protection of the circuits made by etching.

9 Claims, No Drawings

FLEXIBLE BASE MATERIALS FOR PRINTED CIRCUITS

FIELD OF THE INVENTION AND RELATED ART STATEMENT

This invention relates to flexible base materials for printed circuits.

Flexible base materials for printed circuits are usually prepared by bonding a conductor and an organic polymer insulator with an adhesive. However, a thermal hysteresis from contact bonding under heat or the like during the bonding operation has presented a number of problems. One of such problems is that the base material curls, twists, or warps while cooling because of the difference in linear expansion coefficient between the conductor and the insulator, which hinders the subsequent conductor patterning. Another is that the flame retardancy is lowered by the adhesive present between the conductor and the insulator. Still another is a high cost of flexible base materials incurred by the use of expensive polyimide films and by the time-consuming bonding operation.

A number of methods for making flexible base materials without the use of adhesives have been proposed in the attempts to solve the problems arising from the use of adhesives and they are based on the direct coating of a conductor with a solution of an organic polymer as disclosed, for example, by Japan Kokai Tokkyo Koho No. 56-94,689 (1981). These methods have successfully solved the problem of adhesive-related lowering of the flame retardancy, but still left unsolved the problems of the occurrence of curls, twists, and warps from the difference in linear expansion coefficient between the conductor and the insulator and its interference with the subsequent conductor patterning.

Japan Kokai Tokkyo Koho No. 56-23,791 (1981) proposes to coat a metal foil with a solution of polyamideimides, dry off the solvent, and apply a heat treatment to correct the curling which has occured after drying from the difference in linear expansion coefficient. This method, however, is also time-consuming and suffers from a low productivity.

Other methods disclosed in Japan Kokai Tokkyo Koho Nos. 60-157,286 (1985) and 60-243,120 (1985) propose to coat a conductor with a solution of polyimides or their precursors of a specific structure and low thermal expansion to make flexible base materials of reduced curling for printed circuits. The methods, however, possess the following shortcomings: the resin films to be formed on the conductor do not show acceptable properties, particularly in flexibility; flexible printed circuits prepared therefrom undergo a large heat shrinkage when immersed in a soldering bath evidencing poor dimensional stability, do not have good adhesion between the conductor and the insulator, and curl excessively with the conductor on the concave side during etching of the conductor for circuit formation hindering the subsequent operations such as circuit protection.

Commercial flexible printing boards of today are available in two types; single-sided boards having the conductor on only one side and double-sided boards having the conductors on both sides of the insulator. The latter type permits formation of circuits on both sides of the boards and has come into wide use in recent years for high-density packaging.

The flexible base materials for the double-sided boards, however, are made by pasting a conductor such as a copper foil to both sides of an insulating base film by an adhesive, and this structural arrangement has a problem of having normally lower flexibility than the flexible base materials for single-sided boards.

Another problem is that the substantial presence of an adhesive layer adversely affects the properties of the base materials, in particular the excellent heat resistance and flame retardancy characteristic of the polyimide base films. Other adhesive-related problems appear in the fabrication of circuits; they are, more specifically, generation of resin smears in drilling of through holes, lowering in adhesion of plated through holes, and larger dimensional changes in etching.

On the other hand, integrated circuits or printed circuits of higher density under development are accompanied by greater heat generation and sometimes demand the pasting of a good thermal conductor.

The present inventors studied the aforesaid problems from various angles, found that the use of a plurality of polyimides differing from one another in linear expansion coefficient yields good flexible base materials for printed circuits, and completed this invention.

OBJECT AND SUMMARY OF THE INVENTION

An object of this invention is to provide industrially useful flexible printed circuit base materials which do not curl, twist, or wrap on application of a thermal hysteresis and show acceptable adhesive strength, flexibility, and dimensional stability.

Another object of this invention is to provide polyimide films clad with conductors on both sides useful as base materials for double-sided flexible printed circuits, which materials show good dimensional stability during formation of circuits and excellent heat resistance and flexibility.

This invention thus relates to flexible printed circuit base materials which are composed of at least one resin layer consisting of polyimides resins of low thermal expansion, at least one resin layer consisting of polyimide resins of high thermal expansion with a higher linear thermal expansion coefficient than the foregoing polyimide resins, and at least one layer of a conductor.

The polyimide resins of low thermal expansion of this invention have a linear expansion coefficient of less than $20 \times 10^{-6}(1/K)$, preferably $(0-19) \times 10^{-6}(1/K)$. In addition, it is desirable that the films from the resins show good heat resistance and flexibility. The polyimide resins here generically mean resins with a cyclic imide structure and include polyimides, polyamideimides, and polyesterimides. The linear expansion coefficient has been determined on a fully imidated sample by heating it to 250° C. and then cooling it at a rate of 10° C./minute in a thermomechanical analyzer (TMA) and calculating the average linear expansion coefficient between 240° C. and 100° C.

Examples of the aforesaid polyimide resins of low thermal expansion include polyamideimides containing a structural unit of the general formula (I),

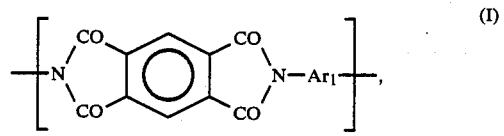

in which $Ar_1$ is a divalent aromatic radical of the formula

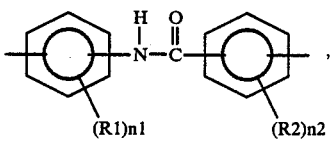

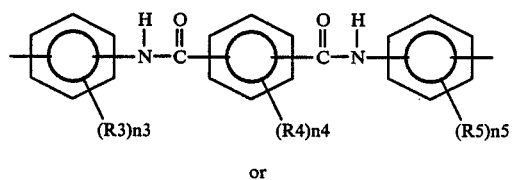

or

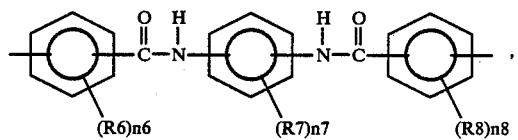

the substituents $R_1$ to $R_8$ are independently of one another lower alkyl groups, lower alkoxy groups, or halogens, and $n_1$ to $n_8$ are integers from 0 to 4 and polyimide resins containing a structural unit of general formula (II),

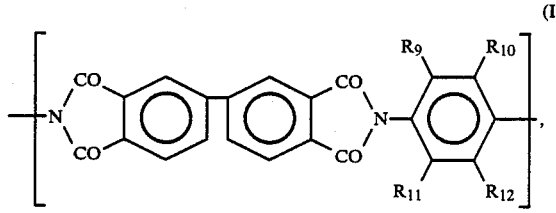

(II)

in which $R_9$ to $R_{12}$ are lower alkyl groups, lower alkoxy groups, or halogens. The lower alkyl group or the lower alkoxy group as represented by $R_1$ to $R_{12}$ preferably has 1 or 2 carbon atoms. Polyimide resins with $Ar_1$ equal to

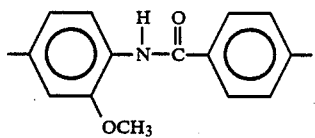

in the structural unit of the general formula (I) are preferable from the viewpoint of low thermal expansion and productability.

The polyimide resins of high thermal expansion of this invention have a higher linear expansion coefficient than the aforesaid polyimide resins of low thermal expansion, preferably by $5 \times 10^{-6}(1/K)$ or more, or more preferably by $10 \times 10^{-6}(1/K)$ or more. The linear expansion coefficient of the polyimide resins of high thermal expansion has no other restrictions than being higher than that of the polyimide resins of low thermal expansion, but it should preferably be $20 \times 10^{-6}(1/K)$ or more, or more preferably $(30-100) \times 10^{-6}(1/K)$. Moreover, it is desirable that the polyimide resins of high thermal expansion are thermoplastic, possess a glass transition temperature of 350° C. or less, and develop sufficient adhesive strength at the interface when pressed under heat and pressure. The polyimide resins of high thermal expansion here include those which do not necessarily show sufficient fluidity in normal conditions above the glass transition temperature but can be bonded under pressure.

Examples of the aforesaid polyimide resins of high thermal expansion include polyimide resines containig a structural unit of the general formula (III),

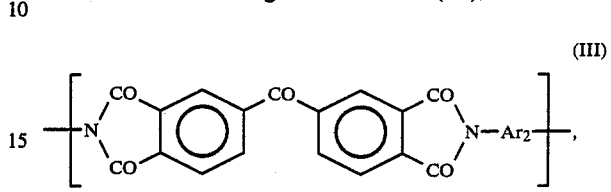

(III)

in which $Ar_2$ is a divalent aromatic radical with 12 or more carbon atoms and polyimide resins containing a structural unit of the general formula (IV),

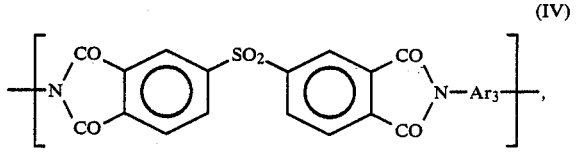

(IV)

in which $Ar_3$ is a divalent aromatic radical with 12 or more carbon atoms.

The aromatic divalent radical $Ar_2$ or $Ar_3$ is exemplified by

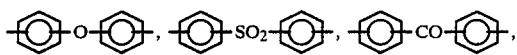

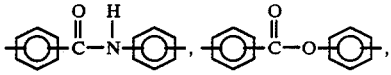

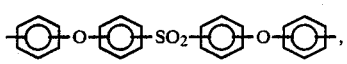

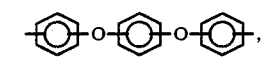

and

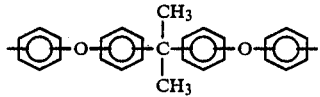

and $Ar_2$ is preferably 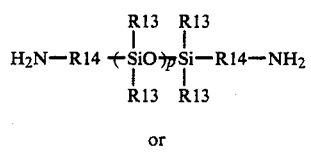.

The polyimide resins may be modified by diaminosiloxanes of the general formula $$H_2N-R_{14}\underset{\underset{R_{13}}{|}}{\overset{\overset{R_{13}}{|}}{(Si}}O)_p\underset{\underset{R_{13}}{|}}{\overset{\overset{R_{13}}{|}}{Si}}-R_{14}-NH_2$$

or

-continued

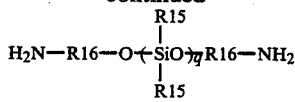

in which $R_{14}$ and $R_{16}$ are divalent organic radicals, $R_{13}$ and $R_{15}$ are monovalent organic radicals, and p and q are integers greater than 1. Furthermore, the polyimide resins of low thermal expansion and those of high thermal expansion may contain other structural units and their linear expansion coefficient, glass transition temperature, and other properties may vary with the proportion of such other structural units. Where necessary, the polyimide resins of this invention may be blended with other polyimide resins.

The precursors for the polyimide resins of low thermal expansion and those of high thermal expansion of this invention are obtained by polymerizing diamines and tetracarboxylic acid anhydrides in suitable solvents. The solvents here should be inert to the diamines and the acid anhydrides and capable of dissolving the polyimides formed. Examples of such solvents are N,N-dimethylformamide, N,N-dimethylacetamide, N-methylpyrrolidone, dimethyl sulfoxide, quinoline, isoquinoline, diethylene glycol dimethyl ether, and diethylene glycol diethyl ether. The solvents may be used singly or as mixture. The polyimide precursors in solution after the polymerization may be applied directly to the conductor or they may be isolated first as solid and then dissolved in another solvent to a suitable concentration before use.

The precursors, if they show solubility in the solvent after conversion to the corresponding polyimides, may be converted first into the polyimides in solution and applied to the conductor.

The solutions of the polyimide precursors or polyimides to be used in this invention may be mixed with a variety of additives such as known acid anhydride- or aminebased curing agents, silane coupling agents, titanate coupling agents, adhesive epoxy resins, and flexibilizer rubbers, and catalysts.

According to this invention, resins differing in linear expansion coefficient are put together to form a composite insulator, with the thickness ($t_1$) of a layer of the resins of high thermal expansion and the thickness ($t_2$) of a layer of the resins of low thermal expansion desirably controlled so as to obtain a ration ($t_2/t_1$) of 0.01 to 20,000, preferably 2 to 100, or more preferably 3 to 25. The terms "high" and "low" here are used with reference to the simple mean of the linear thermal expansion coefficients of individual component layers of the multilayer insulator; a resin layer with a linear expansion coefficient higher than the mean is referred to as a resin layer of high thermal expansion and one with a linear expansion coefficient lower than the mean as a resin of low thermal expansion. If the thickness ratio ($t_2/t_1$) is too small, the linear expansion coefficient of the insulator as a whole becomes to high and different from the linear expansion coefficient of the conductor that the base material curls with the insulator on the concave side; this curling makes the formation of circuits difficult and produces large dimensional changes when released from the stresses during the etching of the conductor. On the other hand, if the ratio ($t_2/t_1$) is too large, it becomes difficult to improve the adhesion to the conductor and to prevent the curling of the film after the etching of the conductor. In this invention, the total thickness of the insulator, or ($t_1+t_2$), is normally from 5 to 10 μm, preferably from 10 to 50 μm.

According to this invention, at least one layer of polyimide resins of high thermal expansion and at least one layer of polyimide resins of low thermal expansion are arbitrarily arranged to form a composite insulator.

An arrangement of a conductor, a layer of resins of high thermal expansion, and a layer of resins of low thermal expansion in this order assures good adhesion, dimensional stability at elevated temperatures, and lowering of the linear expansion coefficient of the insulator as a whole. Another arrangement of a conductor, a layer of resins of low thermal expansion, and a layer of resins of high thermal expansion in this order reduces the curling of the film after the etching of the conductor. Now, a still another arrangement of a conductor, a layer of first resins of high thermal expansion, a layer of resins of low thermal expansion, and a layer of second resins of high thermal expansion in this order can attain the effects of the former two arrangements at the same time. A further arrangement of a conductor, a layer of resins of high thermal expansion, a layer of first resins of low thermal expansion, and a layer of second resins of low thermal expansion with a higher linear expansion coefficient than that of the first can reduce the curling of the film still further. It is possible to build double-sided base materials with conductors on both sides and polyimide resins of low thermal expansion and those of high thermal expansion placed inside in any of the above-mentioned arrangements while producing the same effects as above. Variation of the kind and arrangement of the resins of low thermal expansion and those of high thermal expansion permits easy control of the mechanical properties of the films such as modulus and strength in answer to various needs of clients.

The flexible printed circuit base materials of this invention comprise at least a conductor and an insulator and the conductor may be any of copper, aluminum, iron, silver, palladium, nickel, chromium, molybdenum, tungsten, and their alloys. Copper is preferable and constitutes at least one layer in case of a multilayer conductor.

The surface of the conductors may be chemically or mechanically treated for improvement of the adhesive strength, for example, by sanding, plating with nickel or copper-zinc alloys, or coating with aluminum alcoholates, aluminum chelates, or silane coupling agents.

The flexible printed circuit base materials of this invention can be prepared as follows.

The coating of the conductor with a solution of the resins can be effected by any of the known methods such as knife coating, roll coating, die coating, and curtain coating. It is also possible to effect coating with two or more polyimide resins simultaneously with the use of a coater fitted with a multilayer die.

The concentration of the polyimide precursor solution for such coating depends on the degree of polymerization of the polymers in question, but it is from 5 to 30% by weight, preferably from 10 to 20% by weight. A solution with a concentration of 5% by weight or less does not yield a film of a sufficient thickness in one coating operation while a solution with a concentration of 30% by weight or more is too viscous for easy application.

The solution of polyamic acids applied in a uniform thickness on the conductor is stripped of the solvent under heat and then allowed to undergo ring closure to form polyimides. It is desirable here to heat the solution gradually from a low temperature to a high temperature as rapid heating at a high temperature form a skin on the surface of the resins which would hinder the evaporation of the solvent or will cause foaming. The final temperature for this heat treatment is preferably from 300° C. to 400° C. Above 400° C., the polyimides start to decompose gradually. At 300° C. or below, the polyimides do not orient themselves sufficiently on the surface of the conductor and do not yield materials of flat surface. The thickness of the polyimide films thus obtained is normally from 10 to 150 μm.

Double-sided flexible base materials are prepared by laminating two aforesaid base materials, resin to resin, in a hot press under heat and pressure, or by placing a conductor on the resin side of the aforesaid base material and similarly hot-pressing. The hot-pressing can be performed in any of known equipment such as hydraulic press, vacuum press, or heat laminator preferably at more than the glass transition temperature of the polyimide resins of high thermal expansion and at a pressure of from 1 to 500 kg/cm depending upon the equipment in use, preferably from 10 to 120 kg/cm.

Another method applicable to the manufacture of double-sided base materials is to treat the polyimide resins of a single-sided material with corona discharge or plasma for improved adhesion and paste two such materials resin to resin.

The flexible printed circuit base materials of this invention are extremely useful industrially as they exhibit high reliability in respect to dimensional stability toward temperature changes, adhesive strength, and flatness after etching and are easy to fabricate in protection of the circuits formed by etching, and can be formed into double-sided flexible printed circuit base materials which are heat-resistant, flexible, and easy to work with in through-hole fabrication.

DETAILED DESCRIPTION OF THE PREFERRED EMBODIMENTS

This invention will be explained with reference to the accompanying examples and comparative examples, but not limited thereto.

The linear expansion coefficient was determined on a fully imidated sample in a thermomechanical analyzer (TMA) SS-10 (manufactured by Seiko Electronic Industrial Corp.) by heating the sample to 250° C., then cooling it at a rate of 10° C./minute, and calculating the average linear expansion coefficient between 240° C. and 100° C.

The adhesive strength was determined in a Tensilon tester by fixing the resin side of a 10 mm-wide copper-clad sample to an aluminum plate by a double-coated adhesive tape and peeling the copper in the 180° C. direction at a rate of 5 mm/minute.

The degree of curling of the film after etching was determined by etching off the copper from a copper-clad sample (100 mm in width, 100 mm in length) by an aqueous solution of ferric chloride, washing the remaining resin film with water, drying it at 100° C. for 10 minutes, and measuring the curvature of the curl generated.

The strength and modulus of elasticity of the film after the etching were determined in accordance with JIS Z-1720 or ASTM D-882-67.

The following symbols are used in the examples and comparative examples.
PMDA: Pyromellitic acid dianhydride
BPDA: 3,3',4,4'-Biphenyltetracarboxylic acid dianhydride
BTDA: 3,3',4,4'-Benzophenonetetracarboxylic acid dianhydride
DSPDA: 3,3',4,4'-Diphenylsulfontetracarboxylic acid dianhydride
DDE: 4,4'-Diaminodiphenyl ether
DDM: 4,4'-Diaminodiphenylmethane
MABA: 2'-Methoxy-4,4'-diaminobenzanilide
PDD: p-Phenylenediamine
DDS: 3,3'-Diaminodiphenyl sulfone
BAPP: 2,2-Bis[4-(4-aminophenoxy)phenyl]propane
BAPB: 1,3-Bis(3-aminophenoxy)benzene
DMAc: Dimethylacetamide
NMP: N-Methyl-2-pyrrolidone

SYNTHETIC EXAMPLE 1

Into a 500 ml four-necked flask fitted with a thermometer, a calcium chloride drying tube, a stirring rod, and a nitrogen inlet tube were introduced 0.1 mole of DDE and 300 ml of DMAc and stirred in a stream of nitrogen flowing at a rate of 200 ml per minute. The resulting solution was held at 10° C. or below in a water-cooled bath and 0.1 mole of BTDA was added slowly. The polymerization reaction occurred with evolution of heat to give a viscous solution of polyamic acids (polyimide precursors).

The coarse side of a 35 μm-thick electrodeposited copper foil (manufactured by Nikko Gould Co., Ltd.) was coated with the polyamic acid solution by an applicator to a film thickness of about 25 μm, dried at 130° C. for 10 minutes and then at 150° C. for 10 minutes in hot-air ovens, and then heated to 360° C. in 15 minutes to effect the imidation reaction.

The copper-clad polyimide film curled considerably with the resin on the concave side. A film obtained by etching the copper with an aqueous solution of ferric chloride showed a linear expanshion coefficient of $55 \times 10{-6}$ (1/K).

SYNTHETIC EXAMPLES 2–6

As in Synthetic Example 1, various diamines and acid anhydrides were polymerized and the solutions of polyimide precursors of high thermal expansion thus prepared were applied to copper foils and imidated to give 25 μm-thick films. The linear expansion coefficient was determined as in Synthetic Example 1 and the results are shown in Table 1.

TABLE 1

| Synthetic Example No. | Diamine Component | Acid Anhydride Component | Linear Expansion Coefficient $\times 10^{-6}$ (1/K) |
| --- | --- | --- | --- |
| 1 | DDE | BTDA | 55 |
| 2 | BAPP | BTDA | 73 |
| 3 | DDM | BTDA | 60 |
| 4 | DDS | BTDA | 70 |
| 5 | BAPP | PMDA | 58 |
| 6 | DDF | BPDA | 45 |

SYNTHETIC EXAMPLE 7

As in Synthetic Example 1, 0.055 mole of MABA and 0.045 mole of DDE were dissolved in 300 ml of DMAc, 0.10 mole of PMDA was added, and the mixture was allowed to react to give a viscous solution of polyamic acids.

A polyimide film obtained from the polyamic acids showed a linear expansion coefficient of $13 \times 10^{-6}(1/K)$.

SYNTHETIC EXAMPLE 8

As in Synthetic Example 1, 0.090 mole of PPD and 0.010 mole of DDE were dissolved in 300 ml of DMAc, 0.1 mole of BPDA was added, and the mixture was allowed to react to give a viscous solution of polyamic acids.

A polyimide film obtained from the polyamic acids showed a linear expansion coefficient of $10 \times 10^{-6}(1/K)$.

EXAMPLES 1-6

The resin solutions prepared in Synthetic Examples 1-6 were each applied to an electrodeposited copper foil to a resin thickness of 2 μm and dried at 130° C. for 5 minutes. Each first resin layer was then coated with the resin solution of synthetic Example 7 to a resin thickness of 23 μm, dried at 130° C. for 10 minutes and at 150° C. for 10 minutes in hot-air ovens to form a second resin layer, and then heated to 360° C. in 15 minutes to effect the imidation and obtain a copper-clad film with the total resin thickness of 25 μm.

The copper-clad films were tested for the adhesive strength, curvature of the curl, heat shrinkage, and thermal expansion coefficient. The results are shown in Table 2.

As is apparent from Table 2, the copper-clad films of Examples 1-6 are nearly flat and show lower thermal expansion coefficient, higher adhesive strength, smaller curvature of the curl, and lower heat shrinkage than those of Comparative Examples.

The film of Example 1 showed strength of 25 kg/mm² and modulus of elasticity of 500 kg/mm².

EXAMPLE 7

Copper-clad films were prepared as in Example 1-6, except that the resin solution of Synthetic Example 8 was used in place of that of Synthetic example 7, and tested for the adhesive strength, curl of the film, heat shrinkage, and thermal expansion coefficient. The results are shown in Table 2.

COMPARATIVE EXAMPLES 1 AND 2

The copper-clad films of Synthetic Examples 7 and 8 were tested for the adhesive strength, curl of the film, heat shrinkage, and thermal expansion coefficient. The results are shown in Table 2.

EXAMPLES 8-11

The copper-clad film of Synthetic Example 7 was coated on the resin side with each of the resin solutions of Synthetic Examples 1-4 to a resin thickness of 2 μm, dried at 130° C. for 5 minutes, and imidated by heating to 360° C. in 15 minutes to give a copper-clad film with the total resin thickness of 27 μm.

The copper-clad films thus obtained were tested for the adhesive strength, curl of the film, heat shrinkage, and thermal expansion coefficient. The results are shown in Table 2.

As is apparent from Table 2, the curl of the films of Examples 8-11 is sharply reduced.

EXAMPLES 12-15

The copper-clad film of Example 1 was coated on the resin side with each of the resin solutions of Synthetic Examples 1-4 to a resin thickness of 2 μm, dried at 130° C. for 5 minutes to form a third resin layer, and imidated by heating to 360° C. in 15 minutes to form a copper-clad film with the total resin thickness of 27 μm.

The copper-clad film thus obtained was tested for the adhesive strength, curl of the film, heat shrinkage, and thermal expansion coefficient. The results are shown in Table 2.

As is apparent from the results in Table 2, the films of Examples 12-15 show a considerable increase in adhesive strength and decrease in curl.

EXAMPLE 16

The copper-clad film of Example 7 was coated with the resin solution of Synthetic Example 1 to a resin thickness of 2 μm, dried at 130° C. for 5 minutes, and imidated by heating to 360° C. in 15 minutes to give a copper-clad film with the total resin thickness of 27 μm.

The copper-clad film thus obtained was tested for the adhesive strength, curl of the film, heat shrinkage, and thermal expansion coefficient. The results are shown in Table 2.

COMPARATIVE EXAMPLES 3 AND 4

As in Synthetic Example 7 or 8, a copper-clad film containing a single resin layer with a thickness of 27 μm was prepared and tested for the adhesive strength, curl of the film, heat shrinkage, and thermal expansion coefficient. The results are shown in Table 2.

COMPARATIVE EXAMPLE 5

The copper-clad film obtained in Synthetic Example 1 was tested for the adhesive strength, curl of the film, heat shrinkage, and thermal expansion coefficient. The results are shown in Table 2.

The film showed strength of 18 kg/mm² and modulus of elasticity of 250 kg/mm².

TABLE 2

| | Thickness of Total Resin Layer (μm) | First Resin Layer | | | | Thickness of Layer (μm) | Second Resin Layer | | | | Thickness of Layer (μm) |
| | | Diamine Component | | Acid Anhydride Component | | | Diamine Component | | Acid Anhydride Component | | |
| | | Kind | Amount Used | Kind | Amount Used | | Kind | Amount Used | Kind | Amount Used | |
|---|---|---|---|---|---|---|---|---|---|---|---|
| Example 1 | 25 | DDE | 0.1 | BTDA | 0.1 | 2 | MABA DDE | 0.055 0.045 | PMDA | 0.1 | 23 |
| Example 2 | " | BAPP | " | " | " | " | MABA DDE | 0.055 0.045 | " | " | " |
| Example 3 | " | DDM | " | " | " | " | MABA DDE | 0.055 0.045 | " | " | " |
| Example 4 | " | DDS | " | " | " | " | MABA DDE | 0.055 0.045 | " | " | " |

TABLE 2-continued

| | | | | | | | | | | | |
|---|---|---|---|---|---|---|---|---|---|---|---|
| Example 5 | " | BAPP | " | PMDA | " | " | MABA<br>DDE | 0.055<br>0.045 | " | " | " |
| Example 6 | " | DDE | " | BPDA | " | " | MABA<br>DDE | 0.055<br>0.045 | " | " | " |
| Example 7 | " | DDE | " | BTDA | " | " | PPD<br>DDE | 0.090<br>0.010 | BPDA | " | " |
| Example 8 | 27 | MABA<br>DDE | 0.055<br>0.045 | PMDA | " | 25 | DDE | 0.1 | BTDA | " | 2 |
| Example 9 | " | MABA<br>DDE | 0.055<br>0.045 | " | " | " | BAPP | " | " | " | " |
| Example 10 | " | MABA<br>DDE | 0.055<br>0.045 | " | " | " | DDM | " | " | " | " |
| Example 11 | " | MABA<br>DDE | 0.055<br>0.045 | " | " | " | DDS | " | " | " | " |
| Example 12 | " | DDE | 0.1 | BTDA | " | 2 | MABA<br>DDE | 0.055<br>0.045 | PMDA | " | 23 |
| Example 13 | " | " | " | " | " | " | MABA<br>DDE | 0.055<br>0.045 | " | " | " |
| Example 14 | " | " | " | " | " | " | MABA<br>DDE | 0.055<br>0.045 | " | " | " |
| Example 15 | " | " | " | " | " | " | MABA<br>DDE | 0.055<br>0.045 | " | " | " |
| Example 16 | " | " | " | " | " | " | PPD<br>DDE | 0.090<br>0.010 | BPDA | " | " |
| Comparative Example 1 | 25 | MABA<br>DDE | 0.055<br>0.045 | PMDA | " | 25 | — | — | — | — | — |
| Comparative Example 2 | " | PPD<br>DDE | 0.090<br>0.010 | BPDA | " | " | — | — | — | — | — |
| Comparative Example 3 | 27 | MABA<br>DDE | 0.055<br>0.045 | PMDA | " | 27 | — | — | — | — | — |
| Comparative Example 4 | " | PPD<br>DDE | 0.090<br>0.010 | BPDA | " | " | — | — | — | — | — |
| Comparative Example 5 | 25 | DDE | 0.1 | BTDA | " | 25 | — | — | — | — | — |

| | Third Resin Layer | | | | | Properties of Copper-clad Films or Films | | | |
|---|---|---|---|---|---|---|---|---|---|
| | Diamine Component | | Acid Anhydride Component | | Thickness of Layer (μm) | Adhesive Strength kg/cm | Curl (*1) mm | Heat Shrinkage % | Linear Expansion Coefficient × 10⁻⁶ (1/K) |
| | Kind | Amount Used | Kind | Amount Used | | | | | |
| Example 1 | — | — | — | — | — | 2.0 | 10 | 0.1 | 1 |
| Example 2 | — | — | — | — | — | 1.8 | 10 | 0.1 | 11 |
| Example 3 | — | — | — | — | — | 1.8 | 10 | 0.1 | 10 |
| Example 4 | — | — | — | — | — | 1.6 | 11 | 0.1 | 11 |
| Example 5 | — | — | — | — | — | 1.6 | 10 | 0.1 | 11 |
| Example 6 | — | — | — | — | — | 1.7 | 10 | 0.1 | 11 |
| Example 7 | — | — | — | — | — | 2.0 | 8 | 0.3 | 9 |
| Example 8 | — | — | — | — | — | 0.8 | Roughly Flat | 0.3 | 13 |
| Example 9 | — | — | — | — | — | 0.8 | " | 0.3 | 13 |
| Example 10 | — | — | — | — | — | 0.8 | " | 0.3 | 13 |
| Example 11 | — | — | — | — | — | 0.8 | " | 0.3 | 13 |
| Example 12 | DDE | 0.1 | BTDA | 0.1 | 2 | 1.8 | " | 0.1 | 11 |
| Example 13 | BAPP | " | " | " | " | 1.8 | " | 0.1 | 11 |
| Example 14 | DDM | " | " | " | " | 1.8 | " | 0.1 | 11 |
| Example 15 | DDS | " | " | " | " | 1.8 | " | 0.1 | 11 |
| Example 16 | DDE | " | " | " | " | 1.8 | " | 0.3 | 9 |
| Comparative Example 1 | — | — | — | — | — | 0.8 | 5 | 0.3 | 13 |
| Comparative Example 2 | — | — | — | — | — | 0.9 | 5 | 0.5 | 10 |
| Comparative Example 3 | — | — | — | — | — | 0.8 | 5 | 0.3 | 13 |
| Comparative Example 4 | — | — | — | — | — | 0.9 | 5 | 0.5 | 10 |
| Comparative Example 5 | — | — | — | — | — | 2.0 | 5 | 1.2 | 55 |

The amounts of the diamines and acid anhydrides used in the first to third resin layers are expressed in moles.
(*1): Curl of the film

SYNTHETIC EXAMPLE 9

Into a glass separable flask were introduced in succession 556 g of DMAc, 28.30 g (0.110 mole) of MABA, and 22.03 g (0.110 mole) of DDE with stirring in a stream of nitrogen. The resulting solution was cooled to 10° C., 47.84 g (0.219 mol) of PMDA was added in such portions as to keep the temperature at 30° C. or less, and the mixture was stirred at room temperature for 2 hours after completion of the addition to obtain a solution of polyimide precursors which showed an apparent viscosity of about 800 poises at 25° C. as determined by a Brookfield viscometer.

SYNTHETIC EXAMPLE 10

As in Synthetic Example 9, 20.00 g (0.185 mole) of PPD as diamine and 54.27 g (0.184 mole) of BPDA as acid anhydride were polyermized in 420 g of NMP as solvent to give a solution of polyimide precursors which showed an apparent viscosity of about 850 poises at 25° C. as determined by a Bookfield viscometer.

SYNTHETIC EXAMPLE 11

As in Synthetic Example 9, 30.00 g (0.103 mole) of BAPB as diamine and 32.90 g (0.102 mole) of BTDA as acid anhydride were polymerized in 252 g of DMAc as solvent to give a solution of polyimide precursors which showed an apparent viscosity of 600 poises at 25° C. as determined by a Brookfield viscometer.

SYNTHETIC EXAMPLE 12

As in Synthetic Example 9, 20.00 g (0.081 mole) of DDS as diamine and 25.96 g (0.081 mole) of BTDA as acid anhydride were polymerized in 138 g of diethylene glycol dimethyl ether as solvent to give a solution of polyimide precursors which showed an apparent viscosity of 100 poises. at 25° C. as determined by a Brookfield viscometer.

SYNTHETIC EXAMPLE 13

As in Synthetic Example 9, 25.00 g (0.061 mole) of BAPP as diamine and 19.62 g (0.061 mole) of BTDA as acid anhydride were polymerized in 178 g of DMAc to give a solution of polyimide precursors which showed an apparent viscosity of 250 poises at 25° C. as determined by a Brookfield viscometer.

SYNTHETIC EXAMPLE 14

As in Synthetic Example 9, 20.00 g (0.081 mole) of DDS as diamine and 28.86 g (0.081 mole) of DPSDA as acid anhydride were polymerized in 147 g of diethylene glycol dimethyl ether to give a solution of polyimide precursors which showed an apparent viscosity of 120 poises at 25° C. as determined by a Brookfield viscometer.

EXAMPLE 17

The solution of the polyimide precursors of low thermal expansion prepared in Synthetic Example 9 was applied uniformly to the coarse side of a 35 μm-thick electrodeposited copper foil (manufactured by Nikko Gould Co., Ltd.) mounted on a 200 mm-square Sus frame by an applicator to a thickness of 240 μm and heated in a hot-air oven at 130° C. for 10 minutes to get rid of the solvent DMAc. Then, the solution of the polyimide precursors of high thermal expansion prepared in Synthetic Example 12 was applied over the dried resin layer by bar coater No. 9 to a thickness of 30 μm, heated at 130° C. for 10 minutes and then at 160° C. for 10 minutes in hot-air ovens, and heated up continuously to 360° C. in 15 minutes to obtain a single-sided film of good flatness free of warps and curls with a resin thickness of 25 μm.

This single-sided film showed a 180° C. peel strength (JIS C-6481) of 0.9 kg/cm between the copper foil and the polyimide layer and the film with the copper foil etched off showed a linear expansion coefficient of $12 \times 10^{-6}(1/K)$.

Two such single-sided films were placed one upon another with the resin sides in contact and held in a hydraulic press at 50 kg/cm² and 340° C. for 10 minutes to obtain a double-sided film of the total thickness of 120 μm.

The peel strength along the heat-bonded interface was 1.2 kg/cm and this dropped slightly to 1.1 kg/cm when the double-sided film was heated at 200° C. for 180 hours in a hot-air oven.

EXAMPLE 18

Single-sided and double-sided films were prepared as in Synthetic Example 11 using the resin solution of Synthetic Example 10 as a solution of polyimide precursors of low thermal expansion and the resin solution of Synthetic Example 11 as a solution of polyimide precursors of high thermal expansion.

The peel strength of the single-sided film was 0.7 kg/cm and the polyimide film obtained therefrom showed a linear thermal expansion coefficient of $9 \times 10^{-6}(1/K)$. The peel strength along the heat-bonded interface of the double-sided film was 1.5 kg/cm and dropped slightly to 1.3 kg/cm when heated at 200° C. for 180 hours.

EXAMPLE 19

The solution of the polyimide precursors of high thermal expansion prepared in Synthetic Example 13 was applied to the coarse surface of a 35 μm-thick electrodeposited copper foil (manufactured by Nikko Gould Co., Ltd.) mounted on a 200 mm-square SUS frame by bar coater No. 9 to a thickness of 30 μm, and stripped of the solvent by heating at 130° C. for 2 minutes in a hot-air oven. The solution of the polyimide precursors of low thermal expansion prepared in Synthetic Example 9 and then the solution of the polyimide precursors of high thermal expansion prepared in Synthetic Example 12 were applied on the first resin layer and heat-treated as in Example 17 to give a single-sided film of a flat surface free of warps and curls and containing three layers of polyimides. The single-sided film showed a peel strength of 1.8 kg/cm and the polyimide film after the etching showed a linear expansion coefficient of of $10 \times 10^{-6}(1/K)$.

Two such single-sided films were heat-bonded as in Example 17 into a double-sided film. The peel strength along the heat-bonded interface was 1.2 kg/cm and dropped slightly to 1.1 kg/cm when heated at 200° C. for 180 hours.

EXAMPLE 20

Single-sided and double-sided films were prepared as in Synthetic Example 17 using the resin solution of Synthetic Example 9 as a solution of polyimide precursors of low thermal expansion and the resin solution of Synthetic Example 14 as a solution of high thermal expansion.

The peel strength of the single-sided film was 0.7 kg/cm and the polyimide film after the etching showed a linear expansion coefficient of $11 \times 10^{-6}(1/K)$. The peel strength along the heat-bonded interface of the double-sided film was 1.4 kg/cm and remained at 1.4 kg/cm when heated at 200° C. for 180 hours.

EXAMPLE 21

The single-sided film of Example 17 and a 35 μm-thick electrodeposited copper foil were put together, with the polyimide side in contact with the coarse side of the copper foil, and held in a hydraulic press at 50 kg/cm² gauge and 330° C. for 10 minutes to obtain a double-sided film with the total thickness of 95 μm. The peel strength along the heat-bonded interface was 1.0 kg/cm and remained uncharged at 1.0 kg/cm when heated at 200° C. for 180 hours in an hot-air oven.

COMPARATIVE EXAMPLE 6

A single-sided film was prepared as in Example 17 using a 15% by weight DMAc solution of the reaction product of DDE with PMDA as the polyimide precursors of low thermal expansion. The copper-clad film curled conspicuously and was not suited for hot-pressing into a double-sided film. The polyimide film after the etching showed a linear expansion coefficient of $45 \times 10^{-6}$(1/K).

What is claimed is:

1. Flexible printed circuit base materials which comprise at least one layer of polyimide resins having a low thermal expansion coefficient of 0 to less than $20 \times 10^{-6}$ (1/K), at least one layer of polyimide resins having a high thermal expansion coefficient of $20 \times 10^{-6}$ (1/K) or more, wherein the difference between higher linear expansion coefficient and said lower linear expansion coefficient is at least $5 \times 10^{-6}$ (1/K); and at least one layer of a conductor.

2. Flexible printed circuit base materials according to claim 1 wherein the polyimide resins of low thermal expansion contain a structural unit of the general formula (I),

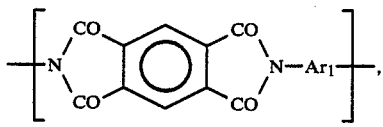

in which $Ar_1$ is a divalent aromatic radical of the general formula

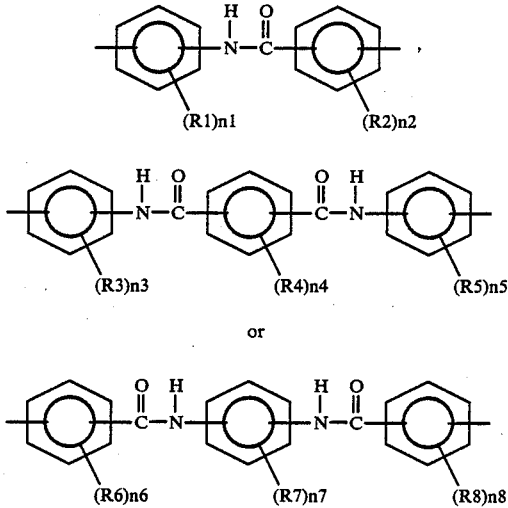

$R_1$ to $R_8$ are independently of one another lower alkyl groups, lower alkoxy groups, or halogens, and $n_1$ to $n_8$ are integers of 0 to 4.

3. Flexible printed circuit base materials according to claim 1 wherein the polyimide resins of low thermal expansion contain a structural unit of the general formula (II),

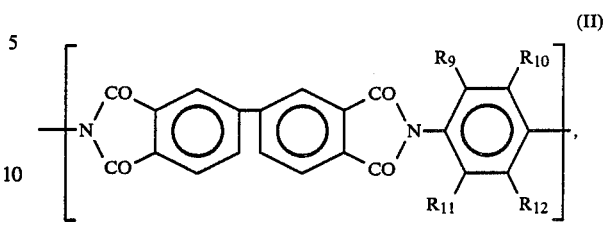

in which $R_9$ to $R_{12}$ are hydrogen, lower alkyl groups, lower alkoxy groups, or halogens.

4. Flexible printed circuit base materials according to claim 1 wherein the thermal expansion coefficient of the polyimide resins of low thermal expansion is $20 \times 10^{-6}$(1/K) or less.

5. Flexible printed circuit base materials according to claim 1 wherein the polyimide resins of high thermal expansion contain a structural unit of the general formula (III),

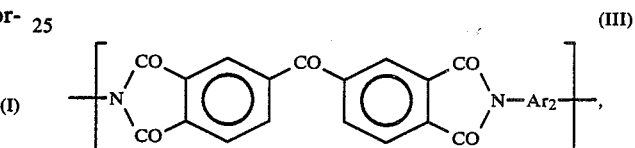

in which $Ar_2$ is a divalent organic radical with 12 or more carbon atoms.

6. Flexible printed circuit base materials according to claim 5 wherein $Ar_2$ is

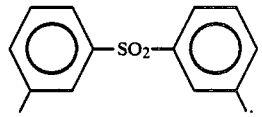

7. Flexible printed circuit base materials according to claim 1 wherein the polyimide resins of high thermal expansion contain a structural unit of the general formula (IV),

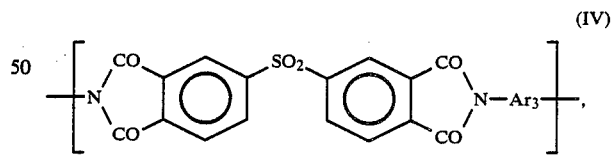

in which $Ar_3$ is a divalent aromatic radical with 12 or more carbon atoms.

8. Flexible printed circuit base materials according to claim 1 wherein conductors are on both sides and at least one layer of said conductors is a copper foil.

9. Flexible printed circuit base materials according to claim 1 wherein the layer adjoining the conductor is polyimide resins of high thermal expansion.

* * * * *